(12) United States Patent
Virkar et al.

(10) Patent No.: US 10,029,916 B2
(45) Date of Patent: Jul. 24, 2018

(54) METAL NANOWIRE NETWORKS AND TRANSPARENT CONDUCTIVE MATERIAL

(75) Inventors: Ajay Virkar, Mountain View, CA (US); Ying-Syi Li, Fremont, CA (US); Melburne C. LeMieux, San Jose, CA (US)

(73) Assignee: C3Nano Inc., Hayward, CA (US)

( * ) Notice: Subject to any disclaimer, the term of this patent is extended or adjusted under 35 U.S.C. 154(b) by 868 days.

(21) Appl. No.: 13/530,822

(22) Filed: Jun. 22, 2012

(65) Prior Publication Data
US 2013/0341074 A1    Dec. 26, 2013

(51) Int. Cl.
| | |
|---|---|
| *H05K 1/03* | (2006.01) |
| *H05K 3/00* | (2006.01) |
| *H05K 1/02* | (2006.01) |
| *H05K 1/09* | (2006.01) |

(Continued)

(52) U.S. Cl.
CPC .............. *B82Y 30/00* (2013.01); *H05K 1/097* (2013.01); *H05K 3/1283* (2013.01); *H05K 2201/0108* (2013.01); *H05K 2201/026* (2013.01)

(58) Field of Classification Search
CPC .... H01B 1/02; G06F 3/041; H05K 2201/026; H05K 1/09; H05K 1/092; H05K 1/0274; H05K 1/097; H05K 2201/0108
See application file for complete search history.

(56) References Cited

U.S. PATENT DOCUMENTS

| | | | |
|---|---|---|---|
| 6,741,019 B1 | 5/2004 | Filas et al. | |
| 7,849,424 B2 | 12/2010 | Wolk et al. | |
| 7,902,639 B2 | 3/2011 | Garrou et al. | |

(Continued)

FOREIGN PATENT DOCUMENTS

| | | |
|---|---|---|
| JP | 2009-129882 A | 6/2009 |
| JP | 5289859 B2 | 2/2010 |

(Continued)

OTHER PUBLICATIONS

Bi et al., "In situ Oxidation synthesis of AG/AGCI core-shell nanowires and their photocatalytic properties," Chem. Commun. (2009), pp. 6551-6553.
De et al., "Silver Nanowire Networks as Flexible, Transparent Conducting Films: Extremely High DC to Optical Conductivity Ratio," ACS Nano, 3(7):1767-1774 (Jun. 2009).

(Continued)

*Primary Examiner* — Timothy Thompson
*Assistant Examiner* — Amol Patel
(74) *Attorney, Agent, or Firm* — Christensen, Fonder, Dardi & Herbert PLLC; Peter S. Dardi

(57) ABSTRACT

Metal nanowires, such as silver nanowires coated on a substrate were fused together to form fused metal nanowire networks that have greatly improved conductivity while maintaining good transparency. Materials formed form the fused metal nanowire networks described herein can have a transparency to visible light of at least about 85% and a sheet resistance of no more than about 100 Ohms/square or a transparency to visible light of at least about 90% and a sheet resistance of no more than about 250 Ohms/square. The method of forming such a fused metal nanowire networks are disclosed that involves exposure of metal nanowires to various fusing agents on a short timescale. When formed into a film, materials comprising the metal nanowire network demonstrate low sheet resistance while maintaining desirably high levels of optical transparency, making them suitable for transparent electrode formation.

17 Claims, 8 Drawing Sheets

(51) Int. Cl.
*B82Y 30/00* (2011.01)
*H05K 3/12* (2006.01)

(56) References Cited

U.S. PATENT DOCUMENTS

| | | | |
|---|---|---|---|
| 7,922,787 | B2 | 4/2011 | Wang et al. |
| 8,018,563 | B2 | 9/2011 | Jones et al. |
| 8,018,568 | B2 | 9/2011 | Allemand et al. |
| 8,031,180 | B2 | 10/2011 | Miyamoto et al. |
| 8,049,333 | B2 | 11/2011 | Alden et al. |
| 8,052,773 | B2 | 11/2011 | Takada |
| 8,094,247 | B2 | 1/2012 | Allemand et al. |
| 8,174,667 | B2 | 5/2012 | Allemand et al. |
| 8,198,796 | B2 | 6/2012 | Takada |
| 9,150,746 | B1 | 10/2015 | Li et al. |
| 9,183,968 | B1 | 11/2015 | Li et al. |
| 9,447,301 | B2 | 9/2016 | Li et al. |
| 2005/0074589 | A1 | 4/2005 | Pan et al. |
| 2005/0196707 | A1 | 9/2005 | Cok |
| 2005/0214480 | A1 | 9/2005 | Garbar et al. |
| 2005/0215689 | A1 | 9/2005 | Garbar et al. |
| 2006/0052947 | A1 | 3/2006 | Hu |
| 2006/0083694 | A1 | 4/2006 | Kodas |
| 2006/0163744 | A1 | 7/2006 | Vanheusden et al. |
| 2006/0205240 | A1 | 9/2006 | Pan et al. |
| 2008/0003130 | A1 | 1/2008 | Xia et al. |
| 2008/0034921 | A1 | 2/2008 | Vanheusden et al. |
| 2008/0050513 | A1 | 2/2008 | Wang et al. |
| 2008/0143906 | A1 | 6/2008 | Allemand et al. |
| 2008/0210052 | A1 | 9/2008 | Allemand |
| 2008/0213663 | A1 | 9/2008 | Hu et al. |
| 2008/0259262 | A1 | 10/2008 | Jones et al. |
| 2008/0283799 | A1 | 11/2008 | Alden et al. |
| 2008/0286447 | A1 | 11/2008 | Alden et al. |
| 2008/0286488 | A1 | 11/2008 | Li et al. |
| 2008/0292979 | A1 | 11/2008 | Ding et al. |
| 2008/0317982 | A1 | 12/2008 | Hecht et al. |
| 2009/0011147 | A1 | 1/2009 | Dictus |
| 2009/0052029 | A1 | 2/2009 | Dai et al. |
| 2009/0088326 | A1 | 4/2009 | Baecker |
| 2009/0098405 | A1 | 4/2009 | Matsunami |
| 2009/0129004 | A1 | 5/2009 | Gruner |
| 2009/0130433 | A1 | 5/2009 | Takada |
| 2009/0166055 | A1 | 7/2009 | Guiheen et al. |
| 2009/0196788 | A1 | 8/2009 | Wang et al. |
| 2009/0223703 | A1 | 9/2009 | Winoto |
| 2009/0242231 | A1 | 10/2009 | Miyagisima et al. |
| 2009/0283304 | A1 | 11/2009 | Winoto |
| 2009/0301769 | A1 | 12/2009 | Seppa et al. |
| 2009/0305437 | A1 | 12/2009 | Allemand et al. |
| 2009/0311530 | A1 | 12/2009 | Hirai et al. |
| 2009/0317435 | A1 | 12/2009 | Vandesteeg et al. |
| 2009/0321113 | A1 | 12/2009 | Allemand et al. |
| 2009/0321364 | A1 | 12/2009 | Spaid et al. |
| 2010/0078197 | A1 | 4/2010 | Miyagishima et al. |
| 2010/0078602 | A1 | 4/2010 | Hosoya et al. |
| 2010/0197068 | A1 | 8/2010 | Poon et al. |
| 2010/0243295 | A1* | 9/2010 | Allemand ............... B82Y 10/00 174/250 |
| 2010/0307792 | A1 | 12/2010 | Allemand et al. |
| 2011/0024159 | A1 | 2/2011 | Allemand et al. |
| 2011/0042126 | A1 | 2/2011 | Spaid et al. |
| 2011/0045272 | A1 | 2/2011 | Allemand |
| 2011/0048170 | A1 | 3/2011 | Bhatia et al. |
| 2011/0062389 | A1 | 3/2011 | Wang et al. |
| 2011/0088770 | A1 | 4/2011 | Allemand et al. |
| 2011/0094651 | A1 | 4/2011 | Kuriki |
| 2011/0095275 | A1 | 4/2011 | Li et al. |
| 2011/0151211 | A1 | 6/2011 | Chang et al. |
| 2011/0162870 | A1 | 7/2011 | Markovich et al. |
| 2011/0163403 | A1 | 7/2011 | Bhatia et al. |
| 2011/0174190 | A1 | 7/2011 | Sepa et al. |
| 2011/0192633 | A1 | 8/2011 | Allemand |
| 2011/0253668 | A1 | 10/2011 | Winoto et al. |
| 2011/0285019 | A1 | 11/2011 | Alden et al. |
| 2011/0297642 | A1 | 12/2011 | Allemand et al. |
| 2012/0033367 | A1 | 2/2012 | Jones et al. |
| 2012/0034129 | A1 | 2/2012 | Suh et al. |
| 2012/0073947 | A1 | 3/2012 | Sakata et al. |
| 2012/0097059 | A1 | 4/2012 | Allemand et al. |
| 2012/0103660 | A1 | 5/2012 | Gupta et al. |
| 2012/0104374 | A1 | 5/2012 | Allemand |
| 2012/0107598 | A1* | 5/2012 | Zou ..................... C09D 7/1291 428/292.1 |
| 2012/0127097 | A1* | 5/2012 | Gaynor ................. B82Y 20/00 345/173 |
| 2012/0127113 | A1 | 5/2012 | Yau et al. |
| 2012/0132930 | A1 | 5/2012 | Young et al. |
| 2012/0138913 | A1 | 6/2012 | Alsayed et al. |
| 2012/0168684 | A1 | 7/2012 | Magdassi et al. |
| 2012/0223358 | A1 | 9/2012 | Pschenitzka |
| 2013/0000952 | A1 | 1/2013 | Srinivas et al. |
| 2013/0001478 | A1 | 1/2013 | Allemand et al. |
| 2013/0146335 | A1* | 6/2013 | Gambino ............ H01L 31/1884 174/251 |
| 2013/0056244 | A1 | 7/2013 | Srinivas et al. |
| 2013/0189502 | A1 | 7/2013 | Takahashi et al. |
| 2013/0266795 | A1 | 10/2013 | Schultz et al. |
| 2013/0342221 | A1 | 12/2013 | Virkar et al. |
| 2014/0054515 | A1 | 2/2014 | Lowenthal et al. |
| 2014/0099486 | A1 | 4/2014 | Ollmann et al. |
| 2014/0238833 | A1 | 8/2014 | Virkar et al. |
| 2014/0251662 | A1 | 9/2014 | Rotto et al. |
| 2014/0255707 | A1 | 9/2014 | Philip et al. |
| 2014/0374146 | A1 | 12/2014 | Saito et al. |
| 2015/0144380 | A1 | 6/2015 | Yang et al. |
| 2015/0206623 | A1 | 7/2015 | Poon |
| 2015/0208498 | A1 | 7/2015 | Poon |
| 2015/0321257 | A1 | 11/2015 | Suh et al. |
| 2016/0096967 | A1 | 4/2016 | Virkar et al. |
| 2016/0108256 | A1 | 4/2016 | Yang et al. |
| 2016/0122562 | A1 | 5/2016 | Yang et al. |

FOREIGN PATENT DOCUMENTS

| | | |
|---|---|---|
| JP | 2012009383 A | 1/2012 |
| JP | 2012-022844 A | 2/2012 |
| JP | 2012-216535 A | 11/2012 |
| KR | 10-2007-0029151 | 3/2007 |
| KR | 10-2010-0098448 A | 9/2010 |
| KR | 20130027634 A | 3/2013 |
| WO | 2008/046058 A2 | 4/2008 |
| WO | 2009-035059 A1 | 3/2009 |
| WO | 2009/086161 | 7/2009 |
| WO | 2009/156990 A1 | 12/2009 |
| WO | 2010/036113 A1 | 4/2010 |
| WO | 2011008227 A1 | 1/2011 |
| WO | 2011-106730 A2 | 9/2011 |
| WO | 2012-168941 A1 | 12/2012 |
| WO | 2013/006349 A1 | 1/2013 |
| WO | 2013-025330 A2 | 2/2013 |
| WO | 2013/040245 A2 | 3/2013 |
| WO | 2013-095971 A1 | 6/2013 |

OTHER PUBLICATIONS

Grouchko et al., "Conductive Inks with 'built-in' mechanism that enables sintering at room temperature," ACS Nano, 5(4):3354-3359 (2011).

Hu et al., "Scalable coating properties of flexible, silver nanowire electrodes," ACS Nano, 4(5):2955-2963 (2010).

Lam et al., "Self-diffusion in silver at low temperatures," Phys. Stat. Sol. (b), 57 (1973), p. 225-236.

Liu et al., "Silver Nanowire-Based Transparent, Flexible and Conductive Thin Film," Nanoscale Research Letters, vol. 6(75), Jan. 2011, 8 pages.

Luo et al., "Size effect on thermodynamic properties of silver nanoparticles," J. Phys. Chem. C, 112 (2008), pp. 2359-2369.

Magdassi et al., "Triggering the Sintering of Silver Nanoparticles at Room Temperature," ACS Nano, 4(4):1943-1948 (2010).

Nanda, et al., "Higher surface free energy of free nanoparticles," Phys. Rev. Letters, 91(10):106102-1 (2003).

(56) References Cited

OTHER PUBLICATIONS

Redmond et al., "Electrochemical Ostwald ripening of colloidal Ag particles on conductive substrates," Nano Letters, 5(1):131-135 (2005).
Safaei et al., "Modeling the Melting Temperature of Nanoparticles by an Analytical Approach," J. Phys. Chem. C, 112 (2008), pp. 99-105.
Sun et al., "AgCl nanoparticle nanowires fabricated by template method," Materials Letters, 61 (2007), pp. 1645-1648.
Van Heyningen, R., "Electron Drift Mobility in Silver Chloride," Physical Review, (Dec. 1, 1962), pp. 2112-2118.
Yan et al., "Recent Research Progress on Preparation of Silver Nanowires by Soft Solution Method," Rev. Adv. Mater. Sci. 24, (2010), pp. 10-15.
Raaen, A.M., "Diffusion in silver fluoride," Physical Review B, 21(10):4895-4897 (1980).
Pothoven, "Laser Patterning of Silver Nanowires," Information Display Magazine, Sep. 2012, 28(9), (10 pages).
International Search Report and Written Opinion for co-pending application PCT/US2013/046866 dated Dec. 27, 2013 (15 pages).
Garnett et al., "Self-limited Plasmonic Welding of Silver Nanowire Junctions," Nature Materials, vol. 11, pp. 241-249, Mar. 2012.
Spechler et al., "Direct Write Pulsed Laser Processed Silver Nanowire Networks for Transparent Conducting Electrodes," Springer-Verlag, vol. 108, pp. 25-28, May 10, 2012.
Tokuno et al., "Fabrication of Silver Nanowire Transparent Electrodes at Room Tempature," Nano Research, (2011), 4(12): 1215-1222.
Zhu et al., "Transferable Self-welding Silver Nanowire Network as High Performance Transparent Flexible Electrode," Nanotechnology 24, (Jul. 26, 2013), 24(335202): 1-7.

* cited by examiner

Fig. 1
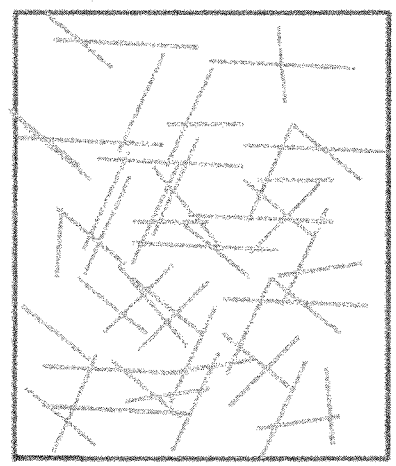
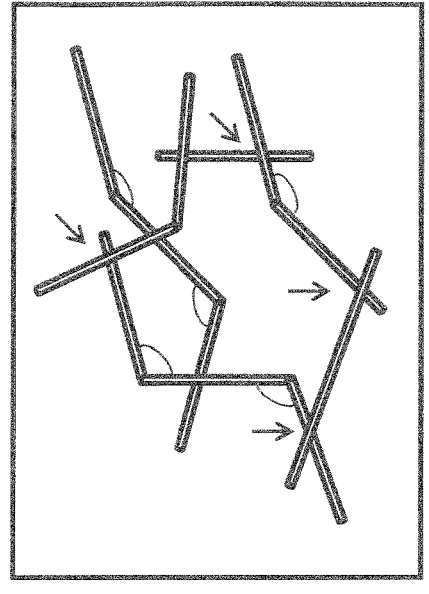
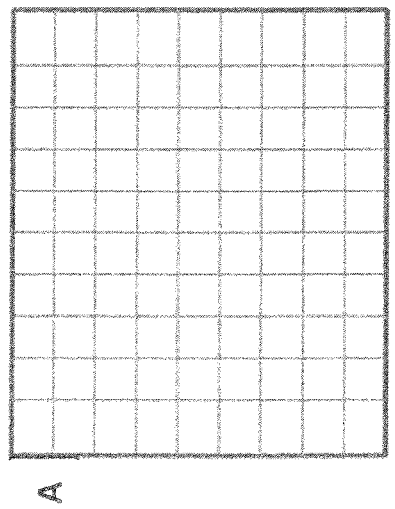
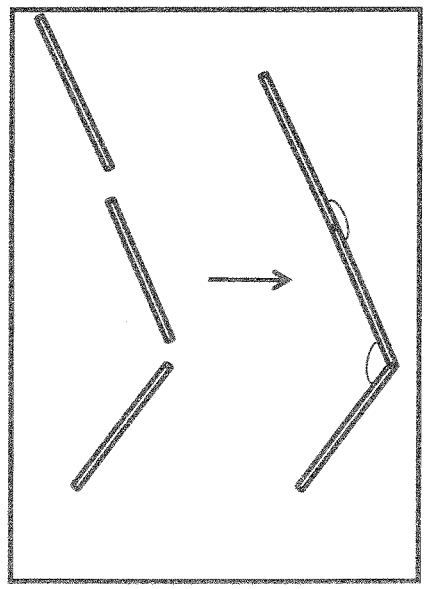

METAL NANOWIRE NETWORKS AND TRANSPARENT CONDUCTIVE MATERIAL

FIELD OF THE INVENTION

The invention relates to fused networks of metal nanowires that are suitable for the formation of electrically conductive and transparent films, such as for use as transparent electrodes. The inventions are further related to chemical methods for fusing the nanowires to form networks as well as to devices incorporating the fused metal nanowire networks.

BACKGROUND

Functional films can provide important functions in a range of contexts. For example, electrically conductive films can be important for the dissipation of static electricity when static can be undesirable or dangerous. Optical films can be used to provide various functions, such as polarization, anti-reflection, phase shifting, brightness enhancement or other functions. High quality displays can comprise one or more optical coatings.

Transparent conductors can be used for several optoelectronic applications including, for example, touch-screens, liquid crystal displays (LCD), flat panel display, organic light emitting diode (OLED), solar cells and smart windows. Historically, indium tin oxide (ITO) has been the material of choice due to its relatively high transparency at high conductivities. There are however several shortcomings with ITO. For example, ITO is a brittle ceramic which needs to be deposited using sputtering, a fabrication process that involves high temperatures and vacuum and therefore is relatively slow and not cost effective. Additionally, ITO is known to crack easily on flexible substrates.

SUMMARY OF THE INVENTION

In a first aspect, the invention pertains to a material that comprises a transparent conductive coating and a substrate on which the coating is supported. The coating has fused metal nanowire networks that comprise fused metal nanowires. The coating in general has a transparency to visible light of at least about 85% and a sheet resistance of no more than about 100 Ohms/square or a transparency to visible light of at least about 90% and a sheet resistance of no more than about 250 Ohms/square. In some embodiments, the metal nanowires have an aspect ratio from about 50 to about 5000 and a diameter of no more than about 250 nm. In additional embodiments, the metal nanowires have an aspect ratio from about 100 to about 2000 and a diameter from about 10 nm to about 120 nm. The metal nanowires can comprise silver, copper, gold, indium, tin, iron, titanium, platinum, palladium, nickel, cobalt, or an alloy combination thereof. In some embodiment, the metal nanowire comprises silver nanowires. The metal nanowires on the substrate can have a surface loading level that is about 0.1 $\mu g/cm^2$ to about 5 $mg/cm^2$. The substrate used can be glass, polymer, inorganic semiconducting material, inorganic dielectric material, laminates thereof, composites thereof or combinations thereof. In some embodiments, polymeric substrate used can be polyethylene terephthalate (PET), polyacrylate, polyolefin, polyvinyl chloride, fluoropolymer, polyamide, polyimide, polysulfone, polysiloxane, polyetheretherketone, polynorbornene, polyester, polyvinyl alcohol, polyvinyl acetate, acrylonitrile-butadiene-styrene copolymer, polycarbonate, a copolymer thereof or blend thereof. In some embodiments, the material further comprises a polymer film overcoat. In some embodiment, the material has a sheet resistance of no more than about 75 ohm/sq and a transparency of at least about 85% at 550 nm. In other embodiments, the material has a sheet resistance of no more than about 175 ohm/sq and a transparency of at least about 90% at 550 nm.

In a second aspect, the invention pertains to a method of forming a transparent, electrically conductive film. The method comprises the steps of depositing a plurality of metal nanowires as a coating on a surface of a substrate to form a pre-treatment material; and exposing the pre-treatment material to a vapor fusing agent for no more than about 4 minutes to fuse at least some of the metal nanowires together to form the transparent electrically conductive film that comprises fused metal nanowire network. The fusing agent can be a solution of HCl, HBr, HF, LiCl, NaF, NaCl, NaBr, NaI, KCl, $MgCl_2$, $CaCl_2$, $AlCl_3$, $NH_4Cl$, $NH_4F$, AgF, or a combination thereof. The solution can have a halide ion concentration from about 0.1 mM to about 10 M in a polar solvent, an alcohol, and or water solvent. In some embodiment, the fusing agent can be vapor of HCl, HBr, HF, HI or combinations thereof. The exposing to the fusing agent step of the method in general is performed for no more than about 3 minutes. Metal nanowires comprises silver, copper, gold, tin, iron, titanium, indium, platinum, palladium, nickel, cobalt, or an alloy combination thereof can be used in the method. In some embodiment, the silver nanowires is used to form the film. The metal nanowires on the substrate can have a surface loading level that is about 0.1 $\mu g/cm^2$ to about 5 $mg/cm^2$. In some embodiments, the fused metal nanowire network of the film has a transparency to visible light at 550 nm of at least about 85% and a sheet resistance of no more than about 100 Ohms/square. In other embodiments, the fused metal nanowire network has a transparency to visible light at 550 nm of at least about 90% and a sheet resistance of no more than about 250 Ohms/square.

In a third aspect, the invention pertains to a method of forming a transparent electrically conductive film. The method comprises the steps of depositing a dispersion of metal nanowires onto a substrate surface, delivering a solution comprising a fusing agent in a solvent onto the substrate surface; and drying the substrate surface after depositing the metal nanowires and delivering the fusing agent solution to fuse at least some of the metal nanowires into the transparent electrically conductive film comprising a fused metal nanowire network. The fusing agent comprises HCl, HBr, HF, LiCl, NaF, NaCl, NaBr, NaI, KCl, $MgCl_2$, $CaCl_2$, $AlCl_3$, $NH_4Cl$, $NH_4F$, AgF, or a combination thereof. The solution of the fusing agent has a halide ion concentration from about 0.1 mM to about 10 M and a solvent that comprises an alcohol, water, or a combination thereof. In some embodiment, the metal nanowire dispersion further comprises the fusing agent such that the depositing of the nanowire dispersion and the fusing agent solution are performed simultaneously. In some embodiment, the delivering of the fusing agent solution is performed after depositing the metal nanowire dispersion. Metal nanowires comprises silver, copper, gold, tin, iron, titanium, indium, platinum, palladium, nickel, cobalt, or an alloy combination thereof can be used in the method. In some embodiment, the silver nanowires is used to form the film. The metal nanowires on the substrate can have a surface loading level that is about 0.1 $\mu g/cm^2$ to about 5 $mg/cm^2$. In some embodiments, the fused metal nanowire network of the film has a transparency to visible light at 550 nm of at least about 85% and a sheet resistance of no more than about 100 Ohms/square. In other embodiments, the fused metal nanowire network has a transparency to visible light at 550 nm of at least about 90% and a sheet resistance of no more than about 250 Ohms/square.

In a fourth aspect, the invention pertains to a device that comprises at least one transparent electrode that uses a transparent conductive material comprising a fused metal nanowire network described herein.

BRIEF DESCRIPTION OF THE DRAWINGS

FIG. 1A is a schematic drawing of metal grid based transparent electrode formed through a traditional patterning approach.

FIG. 1B is a schematic drawing of a nanowire (NW) based transparent conductive material fabricated from low cost solution processable methods disclosed herein.

FIG. 1C is a schematic drawing illustrating the process of three nanowires being fused together to form an elongated nanowire with two angles around the fused points.

FIG. 1D is a schematic drawing illustrating nanowires being fused together to form a fused NW based transparent conductive material with angles around the fused points and arrows indicating the formation of NW network.

DETAILED DESCRIPTION OF PREFERRED EMBODIMENTS

Figure 2:
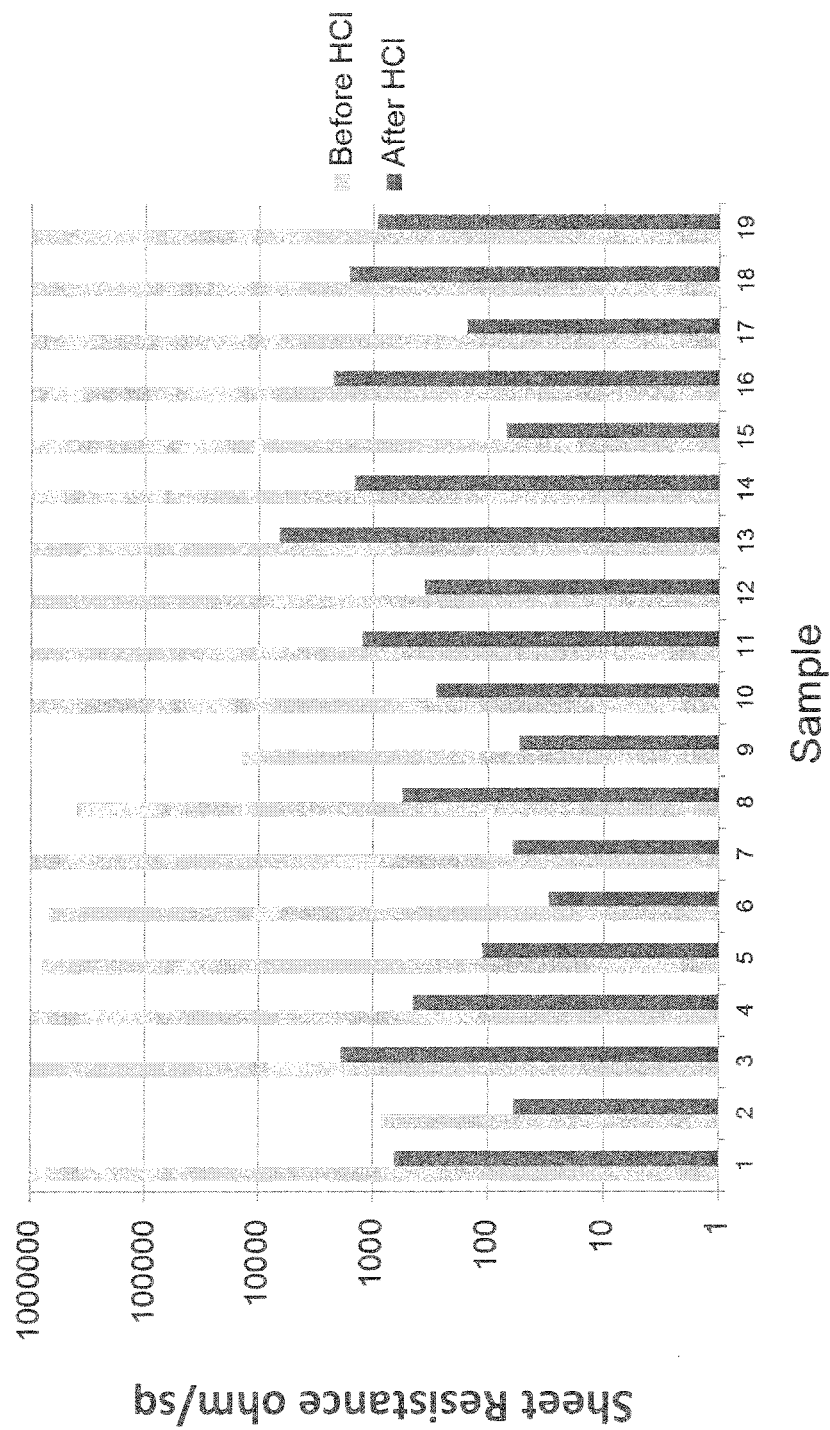
FIG. 2 is a plot of sheet resistance of the samples from the first vendor tested before and after the HCl vapor treatment having a transparency at 550 nm greater than 75%.

A fused metal nanowire network can be formed chemically to achieve a structure with desirably low electrical resistance and high transparency to visible light. The fused metal nanowire network can be formed as a coating for use as a transparent conductive layer. Silver nanowire can be a convenient material to form the network, but other metal nanowires are also suitable for forming the network of fused metal nanowires. The chemical fusing can be performed using gas phase or solution phase ionic inorganic compositions with halogen anions. Since the electrically conductive network can be formed at low temperature, the networks are suitable for use with materials, such as polymers, that cannot tolerate high temperatures. Thus, the conductive networks are well suited to certain transparent electrode applications and the low quantities of materials and low temperature processing can provide for convenient commercial applications.

Metal nanowires can be formed from a range of metals. For example, the production of a range of metal nanowires is described, for example, in published U.S. patent application 2010/0078197 to Miyagishima et al., entitled "Metal Nanowires, Method for Producing the Same, and Transparent Conductor," incorporated herein by reference. There has been particular interest in silver nanowires due to the high electrical conductivity of silver. With respect to the specific production of silver nanowires, see for example, published U.S. patent application 2009/0242231 to Miyagisima et al., entitled "Silver Nanowire, Production Methods Thereof, and Aqueous Dispersion," and U.S. 2009/0311530 to Hirai et al., entitled "Silver Nanowire, Production Method Thereof, and Aqueous Dispersion," and U.S. Pat. No. 7,922,787 to Wang et al., "Methods for the Production of Silver Nanowires," all three of which are incorporated herein by reference. Silver nanowires are commercially available, for example, from Seashell Technologies, LLC, CA, USA.

Silver is known to have a bulk melting point of about 960° C. However, nanoparticles of silver can melt at temperatures less than 150° C. This melting point depression observed for the nanoparticles are believed to be based on the large surface area/volume ratios of the nanoparticles. In general, the larger the surface area/volume ratio, the greater the expected mobility of the surface atoms, and the lower the melting point. Melting points of about 150° C. for silver nanoparticles however may still be too high for a variety of substrates including plastics and elastomers. The time required for melting and cooling can also be in excess of several minutes, which add time and process costs to production.

To produce flexible transparent conductive material that can be produced at reasonable cost and in large scale such as roll-to-roll coating or ink-jet printing method, numerous new materials have been developed as replacements for indium tin oxide (ITO). A potential ITO replacement is a metal-grid shown in FIG. 1A. Metal grids, which can be formed using patterning approaches such as photolithography, can achieve very high performances with low sheet resistances. However, the metal grid films are not solution-processable for example with roll-to-roll coating and therefore are costly to fabricate and often involve fabrication methods which are difficult to scale. While the performance of metal grids may exceed ITO, cost and processability are still hindering their wide-spread adoption.

As shown schematically in FIG. 1B, the metal nanowires deposited into a film from a dispersion can appear to be randomly arrayed rods that intersect with each other randomly, although in practice some alignment of rods can take place depending on the deposition process. While metal nanowires are inherently electrically conducting, the vast majority of resistance in the silver nanowires based films is believed to due to the junctions between nanowires. To improve the properties, it has been proposed to embed the metal nanowires in a secondary electrically conductive medium, see published U.S. patent application 2008/0259262 to Jones et al., entitled "Composite Transparent Conductors and Methods of Forming the Same," incorporated herein by reference. In principle, the junction resistance of a AgNW network can be reduced by sintering or fusing the wires together using heat as disclosed in "Modeling the melting temperature of nanoparticles by an analytical approach." by A. Safaei et. Al. in J. Phys. Chem. C, 2008, 112, 99-105 and in "Size effect on thermodynamic properties of silver nanoparticles" by W. Luo et al. in J. Phys. Chem. C, 2008, 112, 2359-69. The heat can be applied conventionally or by a light source. However, conventional heating may not be practical for many applications since the NWs are not expected to melt until 300-400° C., which is significantly greater than the thermal stability limits of most plastic substrates. Light sources can also be used, but may involve setup of additional and expensive equipment in a large roll-to-roll fabrication. A room or low temperature process which fuses the NWs is therefore highly desirable.

Hu et al. disclosed similar results in ACS Nano, Vol 4, No. 5, 2010, 2955-2963 entitled "Scalable coating properties of flexible, silver nanowire electrodes." Hu et al demonstrated that the junction resistance between the silver nanowires can be in the giga-ohm range, but with processing to 110° C. with the optional addition of significant pressures for short times improved electrical conductivity performance could be obtained.

Low temperature in combination with the application of pressure has been used to achieve a significant decrease in electrical resistance while reasonable levels of transparency were reported. See, De et al., "Silver Nanowire Networks as Flexible, Transparent Conducting Films: Extremely High DC to Optical Conductivity Ratio," ACS Nano Vol. 3(7), pp 1767-1774 (June 2009). The De et al. article does not suggest that fusing of the silver nanowires takes place, and the low temperature used in the process would seem to be too low to result in fusing. The process in the De et al. article involved vacuum filtering and transfer using 100° C. and significant amounts of pressure for 2 hours. This process is not desirable from a commercial processing perspective.

As described herein metal nanowires are fused at room temperature for transparent conductive material applications using a chemical approach. Silver nanowires in particular has been found can be fused together to improve the sheet resistance of the film formed from the $10^5$-$10^8$ Ω/sq range to the 10 to 100 Ω/sq range with less than 0.5% changes to the transparency. Nanowire network thicknesses can be used that provide overall good transparency of at least about 85% for networks with the reported low electrical resistance. The fusing can be achieved in less than a minute that impose little or no change or damage to the morphology of the metal nanowires. Thus, the process is well suited to efficient and relatively inexpensive commercial processing.

It was recently demonstrated by Magdassi and co-workers that thick films of silver nanoparticles (AgNPs) can be "sintered" at room temperature using various chemical agents for non-transparent patterned silver paste application. A process for the chemical fusing of metal nanoparticles is described in published PCT application WO 2010/109465 to Magdassi et al., entitled "Process for Sintering Nanoparticles at Low Temperatures," incorporated herein by reference. The nanoparticle low temperature sintering is further described in Grouchko et al., "Conductive Inks with a "Built-In" Mechanism That Enables Sintering at Room Temperature," ACS Nano Vol. 5 (4), pp. 3354-3359 (2011). The fusing of nanoparticles forms a sheet of metal, which can have a desired low electrical resistance, but the sheet of metal generally does not have desired amounts of transparency.

A vapor based process for the formation of a conductive film from silver nanowires is described in Liu et al., "Silver Nanowire-Based Transparent, Flexible and Conductive Thin Film," Nanoscale Research Letters, Vol. 6(75), 8 pages (January 2011) (hereinafter "the Liu article"). The films formed as described in the Liu article had reasonably low electrical resistance, but the transparency of the films was not satisfactory for many applications. The Liu article attributed their observations to the removal of surface oxidation from the silver nanowires. However, significant deterioration of the nanowire morphology has been observed in the micrographs shown in the Liu article. Improved processing leads to significantly improved results for the fused metal nanowire networks described herein. In particular, desired levels of fusing have been achieved with short time processing of the nanowires with the halide anions without degrading the level of optical transparency and with little deterioration of the nanowire morphology.

For transparent electrode applications, higher-aspect ratio structures like wires or tubes are advantageous since the rod like shape can promote electrical conductivity primarily in-plane. The primarily in-plane conductivity in these rod-like structures allows for "open" areas and thin films which are useful for high light transmission and good 2D sheet conductivities. Nanowires (NWs) are particularly good candidates for transparent conductor applications. However due to their much larger size of about 10s of nanometers in diameter and 10s-100s of microns in length, the surface area/volume ratio of nanowires is considerably smaller than NPs. Silver NWs for example typically do not melt until the temperatures of about 300-400° C. Silver nanowires are $10^4$-$10^5$ times larger in volume relative to nanoparticles and have much smaller ratio of surface area to volume and ratio of surface atoms to bulk atoms. The significant differences in physical size of nanowires relative to nanoparticles imply that the properties are likely to be correspondingly different.

The improved fused metal nanowire networks described herein can achieve simultaneously desirably low sheet resistance values while providing good optical transmission. In some embodiments, the fused metal nanowire networks can have optical transmission at 550 nm wavelength light of at least 85% while having a sheet resistance of no more than about 100 ohms/square. In additional or alternative embodiments, the fused metal nanowire networks can have optical transmission at 550 nm of at least 90% and a sheet resistance of no more than about 250 ohms/sq. Based on the ability to simultaneously achieve good optical transparency and low sheet resistance, the fused metal nanowire films can be used effectively as transparent electrodes for a range of applications. The loading of the nanowires to form the network can be selected to achieve desired properties.

To achieve the desirable properties of the fused metal nanowire networks, it was surprisingly discovered that short time exposure of silver nanowires to halide containing fusing agents could dramatically improve the conductivity of the nanowire networks or films. In general, the metal nanowire networks can be exposed to the fusing agent for times of no more than about 4 minutes to cause the desired fusing, and in some embodiments significantly less time can be used as described further below. The dramatic reduction in sheet resistance may partially be attributed to the removal of the insulating capping polymer polyvinylpyrrolidone (PVP) that is used to stabilize commercial silver nanowires, but is believed to be primarily related to the fusing of the nanowires. SEM studies of the treated silver nanowires indicated clearly the formation of fusing points between the nanowires that are in close proximity of each other as well as significantly reduced amount of detectable PVP polymer. In comparison, the SEM of the untreated silver nanowires clearly shows the presence of PVP polymer and the gap between the ends of the closely situated silver nanowires. Referring to FIG. 1C, a schematic diagram illustrating the process of the ends of three adjacent nanowires being fused together is shown. The fused nanowires form an elongated nanowire with two angles around the fused points. Elongated nanowires can further form a network of elongated nanowires as shown in FIG. 1D, with angles around the fused ends and arrows indicating the connection formation between the elongated nanowires to form the nanowire network.

The fused silver nanowires disclosed herein have considerable differences from the sintered silver nanoparticles disclosed by Magdassi and the treated silver nanowires disclosed by Liu. Specifically, after the sintering process, the AgNPs of Magdassi aggregated together. The profiles of the individual AgNPs that existed prior to the sintering process have been destroyed considerably during the sintering process to form the aggregates. The word sintering indeed is a proper description of the melting and coalescing, and or coarsening of the silver nanoparticles of Magdassi. With regard to the treatment of silver nanowires proposed by Liu, although Liu intended to improve conductivity of the silver nanowires by removal of AgO, the prolonged HCl treatment disclosed by Liu caused observable thinning and shortening of the silver nanowires that seems to have degraded the properties of the resulting material.

In contrast to the processing approach described by Magdassi et al., the current processing approach is directed to the production of networks with a high level of optical transparency. The processing conditions are designed to achieve this objective, and the nanowire morphology is conducive to processing to obtain a desired degree of transparency. In particular, conductive films can have an optical transparency evaluated for convenience at 550 nm light wavelength of at least about 85%.

The processing of the metal nanowire networks described herein comprises the contact of a thin metal nanowire layer, i.e., a network, with a chemical fusing agent comprising a halide anion. The fusing agent can be delivered as a vapor or in solution. For example, acid halides are gaseous and can be delivered in a controlled amount from a gas reservoir or as vapor from a solution comprising the acid halide. Halide salts can be dissolved in solution with a polar solvent with a moderate concentration, and a quantity of the salt solution can be contacted with the nanowire network to fuse adjacent nanowires. Suitable solvents for forming a solution with the chemical fusing agent include, for example, alcohols, ketones, water, or a combination thereof. It has been discovered that superior properties of the fused network results from short processing times for the nanowire network with the fusing agent. The short processing times can be successful to achieve very low levels of sheet resistance while maintaining high optical transparency.

While the processing conditions are designed to produce good optical transparency, the metallic grid-like properties of the fused elongated silver nanowires dramatically increased conductivity with little change in transparency relative to the unfused networks. The drop in electrical resistance may be due to a drop in junction resistance between adjacent nanowires due to fusing of the adjacent nanowires. The treatment described herein may also have improved the connection between the other connecting points indicated by the arrows in FIG. 1D by removing oxidation layer of the nanowires, by removing the capping agent such as PVP of the nanowires, or by at least partially fusing these connection point together. Although removal of the PVP from the surface of silver nanowires have been observed in the examples below, fusing of the silver nanowires at points of contact can also be observed. The final transparent conductive material can best be described as a fused network of silver nanowires, as illustrated in FIG. 1D. The fused metal nanowire network structure has advantages over conventional metal grids described in FIG. 1A due to low cost fabrication methods and solution processability.

In summary, a highly conductive and transparent material was formed at room temperature by fusing the ends of silver nanowires to improve the conductivity without sacrifice the transparency. The resulting material appears to be a silver metallic grid like structure that is highly conductive. The examples below described using HCl as the fusing agent from the vapor phase, dilute solutions of HCl, NaCl, and AgF were also used to create the materials of comparable properties at room temperature. It is understood the metal nanowires could be treated multiple times to achieve the desired degree of fusing, with the same or different fusing agent during each treatment. Although silver nanowires were used to perform the fusing experiments, it is understood that other metal nanowires can be similarly fused together to form materials with improved conductivity.

Electrically Conductive Film Structure and Properties

The conductive films described herein generally comprise a substrate and a fused metal nanowire network deposited on the substrate. An optional polymer coating can be placed over the metal nanowire network to protect and stabilize the fused nanowire network. The parameters of the metal nanowires can be adjusted to achieve desirable properties for the fused network. For example, a higher loading of nanowires can result in a lower electrical resistance, but transparency can decrease with a higher nanowire loading. Through a balance of these parameters, desirable levels of electrical conductivity and optical transparency can be achieved. The nanowires in the improved networks are fused, as is observed in scanning electron micrographs. It is believed that the fusing of the nanowires results in the improved electrical conductivity while maintaining high levels of optical transparency. Having a network with fused nanowires should provide a stable electrically conductive structure over a reasonable lifetime of a corresponding product.

In general, the nanowires can be formed from a range of metals, such as silver, gold, indium, tin, iron, cobalt, platinum, palladium, nickel, cobalt, titanium, copper and alloys thereof are desirable due to high electrical conductivity. Silver in particular provides excellent electrical conductivity, and commercial silver nanowires are available. To have good transparency, it is desirable for the nanowires to have a small range of diameters. In particular, it is desirable for the metal nanowires to have an average diameter of no more than about 250 nm, in further embodiments no more than about 150 nm, and in other embodiments from about 10 nm to about 120 nm. With respect to average length, nanowires with a longer length are expected to provide better electrical conductivity within a network. In general, the metal nanowires can have an average length of at least a micron, in further embodiments, at least 2.5 microns and in other embodiments from about 5 microns to about 100 microns, although improved synthesis techniques developed in the future may make longer nanowires possible. An aspect ratio can be specified as the ratio of the average length divided by the average diameter, and in some embodiments, the nanowires can have an aspect ratio of at least about 25, in further embodiments from about 50 to about 5000 and in additional embodiments from about 100 to about 2000. A person of ordinary skill in the art will recognize that additional ranges of nanowire dimensions within the explicit ranges above are contemplated and are within the present disclosure.

As noted above the amount of nanowires delivered onto the substrate can involve a balance of factors to achieve desired amounts of transparency and electrical conductivity. While thickness of the nanowire network can in principle be evaluated using scanning electron microscopy, the network can be relatively fragile, which can complicate the measurement. In general, the fused metal nanowire network would have an average thickness of no more than about 5 microns. However, the fused nanowire networks are generally relatively open structures with significant surface texture on a submicron scale, and only indirect methods can generally be used to estimate the thickness. The loading levels of the nanowires can provide a useful parameter of the network that can be readily evaluated, and the loading value provides an alternative parameter related to thickness. Thus, as used herein, loading levels of nanowires onto the substrate is presented as microgram or milligrams of nanowires for a square centimeter of substrate. In general, the nanowire networks can have a loading from about 0.1 microgram/cm$^2$ to about 5 milligrams (mg)/cm$^2$, in further embodiments from about 1 microgram/cm$^2$ to about 2 mg/cm$^2$, and in other embodiments from about 5 microgram g/cm$^2$ (μg/cm$^2$) to about 1 mg/cm$^2$. A person of ordinary skill in the art will recognize that additional ranges of thickness and loading within the explicit ranges above are contemplated and are within the present disclosure.

Electrical conductivity can be expressed as a sheet resistance, which is reported in units of ohms per square (Ω/□ or ohms/sq) to distinguish the values from bulk electrical resistance values according to parameters related to the measurement process. Sheet resistance of films is generally measured using a four point probe measurement or an equivalent process. In the Examples below, film sheet resistances were measured using a four point probe, or by making a square using a quick drying silver paste. The fused metal nanowire networks can have a sheet resistance of no more than about 200 ohms/sq, in further embodiments no more than about 100 ohms/sq, and in other embodiments no more than about 60 ohms/sq. A person of ordinary skill in the art will recognize that additional ranges of sheet resistance within the explicit ranges above are contemplated and are within the present disclosure. In general, sheet resistance can be reduced by increasing the loading of nanowires, but an increased loading may not be desirable from other perspectives as described further below, and the loading is not as significant as achieving good fusing for improving the sheet resistance.

For applications as transparent conductive films, it is desirable for the fused metal nanowire networks to maintain good optical transparency. In general, optical transparency is inversely related to the loading, although processing of the network can also significantly affect the transparency. The optical transparency can be evaluated relative to the transmitted light through the substrate. For example, the transparency of the conductive film described herein can be measured by using a UV-Visible spectrophotometer and measuring the total transmission through the conductive film and support substrate. Transmittance is the ratio of the transmitted light intensity (I) to the incident light intensity ($I_o$). The transmittance through the film ($T_{film}$) can be estimated by dividing the total transmittance (T) measured by the transmittance through the support substrate ($T_{sub}$). (T=I/$I_o$ and T/$T_{sub}$=(I/$I_o$)/($I_{sub}$/$I_o$)=I/$I_{sub}$=$T_{film}$) While it is generally desirable to have good optical transparency across the visible spectrum, for convenience, optical transmission is reported herein at 550 nm wavelength of light. In some embodiments, the film formed by the fused network has a transmission at 550 nm of at least 80%, in further embodiments at least about 85% and in additional embodiments, at least about 90%. As noted above, the correlation of good optical transparency with low electrical resistance can be particularly desirable. In some embodiments with a sheet resistance from 20 ohm/sq to about 150 ohm/sq, the films can have an optical transmission at 550 nm of at least about 86%, in further embodiments at least about 88% and in other embodiments from about 89% to about 92%. In one embodiment, the film can have a sheet resistance of no more than about 75 ohm/sq and a transparency of at least about 85% at 550 nm. In another embodiment, the film can have a sheet resistance of no more than about 175 ohm/sq and a transparency of at least about 90% at 550 nm. A person or ordinary skill in the art will recognize that additional ranges of optical transmission within the explicit ranges above are contemplated and are within the present disclosure.

As described in the Examples below, the processing approaches described herein result in the fusing of the metal nanowires. This fusing is believed to contribute to the enhanced electrical conductivity observed and to the improved transparency achievable at low levels of electrical resistance. The fusing is believed to take place at points of near contact of adjacent nanowires during processing. Thus, fusing can involve end-to-end fusing, side wall to side wall fusing and end to side wall fusing. The degree of fusing may relate to the processing conditions. As described further below, short processing times are believed to contribute good fusing without degradation of the nanowire network.

In general, suitable substrates can be selected as desired based on the particular application. Substrate surfaces can comprise, for example, polymers, glass, inorganic semiconductor materials, inorganic dielectric materials, polymer glass laminates, composites thereof, or the like. Suitable polymers include, for example, polyethylene terephthalate (PET), polyacrylate, polyolefins, polyvinyl chloride, fluoropolymers, polyamides, polyimide, polysulfones, polysiloxanes, polyetheretherketones, polynorbornenes, polyester, polyvinyl alcohol, polyvinyl acetate, acrylonitrile-butadiene-styrene copolymer, polycarbonate, copolymers thereof, mixtures thereof and the like. Furthermore, the material can have a polymer overcoat placed on the fused metal nanowire network, and the overcoat polymers can comprise the polymers listed for the substrates above. Moreover, other layers can be added on top or in between the conductive film and substrate to reduce reflective losses and improve the overall transmission of the stack.

Processing of Nanowire Networks

The improved electrical conductivity and optical transparency has been found to be obtained with short time treatment of as deposited metal nanowire films with compounds comprising halogen anions. Desirable increases in electrical conductivity have been achieved with both vapor delivery of the fusing composition or with solution based delivery. The fusing achieves low electrical surface resistance while maintaining high levels of optical transmission.

The formation of the metal nanowire network comprises the formation of a dispersion of the metal nanowires in a suitable liquid and applying the dispersion as a coating onto the selected substrate surface. The concentration of the dispersion can be selected to obtain a good dispersion of the nanowires to provide for a desired degree of uniformity of the resulting coating. In some embodiments, the coating solution can comprise from about 0.1 wt % to about 5.0 wt % metal nanowires, and in further embodiments from about 0.25 wt % to about 2.5 wt % metal nanowires. A person of ordinary skill in the art will recognize that additional ranges of metal nanowire concentrations within the explicit ranges above are contemplated and are within the present disclosure. Similarly, the liquid for forming the dispersion can be selected to achieve good dispersion of the nanowires. For example, alcohols, such as ethanol or isopropyl alcohol, ketone based solvents, such as methyl ethyl ketone, organic coating solvents, such as toluene or hexane, or the like or mixtures thereof, are generally good dispersants for metal nanowires.

Any reasonable coating approach can be used, such as dip coating, spray coating, knife edge coating, bar coating, Meyer-rod coating, slot-die, gravure, spin coating or the like. After forming the coating with the dispersion, the nanowire network can be dried to remove the liquid. The dried film of metal nanowires can then be processed to achieve nanowire fusing.

A first approach to fusing can be performed with acid halide vapor, such as vapor from HCl, HBr, HI or mixtures thereof. HF can also be used, but HF may be corrosive to some substrate materials and is more toxic. Specifically, the dried coating can be exposed to the vapor of the acid halide for a brief period of time. The hydrogen halide compounds are gaseous and are soluble in water and other polar solvents such as alcohol. Generally, the vapor for fusing the metal nanowire film can be generated from a gas reservoir or from vapor given off by solutions of the hydrogen halide compounds. Acidic vapors can quickly be passed over the coating surfaces for example for about 10 s to form the nanowire network. In general, the coating containing the nanowires can be treated with acid vapor for no more than about 4 minutes, in further embodiments for from about 2 seconds to about 3.5 minutes and in other embodiments from about 5 seconds to about 3 minutes. A person of ordinary skill in the art will recognize that additional ranges of treatment times are contemplated and are within the present disclosure.

In further embodiments, the initial metal nanowires can be fused with a solution comprising halide anions. In particular, the solution comprising dissolved acid halide, dissolved metal halide salts or a combination thereof. Suitable compositions for forming the halide solutions include, for example, HCl, HBr, HF, LiCl, NaF, NaCl, NaBr, NaI, KCl, $MgCl_2$, $CaCl_2$, $AlCl_3$, $NH_4Cl$, $NH_4F$, AgF, or a combination thereof. In particular NaCl, NaBr, and AgF provide particularly desirable fusing properties. In general, the halide fusing solution can be added to a previously formed coating comprising the metal nanowires to fuse the metal nanowires. Additionally or alternatively, the halide composition can be combined with the metal nanowire dispersion that is then deposited as a coating so that the metal nanowires and the fusing agent are simultaneously deposited. If the fusing agent is included with the metal nanowires in the metal nanowire dispersion, a separate fusing solution can also be delivered onto the metal nanowire coating to add an additional quantity of fusing agent.

The solutions for separate application of the fusing agent generally comprise halide ions at concentrations of at least about 0.01 mM, in some embodiments, from about 0.1 mM to about 10M, in further embodiments from about 0.1 M to about 5 M. The metal nanowires can be contacted with the halide solution using any reasonable approach such as dip coating, spraying, or the like. Alternatively or additionally, the halide salt or acid can be added directly to dispersant of nanowires in ranges from 0.01 mM to about 1M to form a nanowire and halide mixture. The mixture is then coated onto the substrate surface as described above to form a coating. The film formation process then results in the direct formation of the film with the fusing agent already present. Whether the solution comprising halide anions is delivered with the metal nanowire coating solution, with a separate fusing solution or both, the nanowires in the coating form fused nanowire networks upon solvent removal and the saturation of the halide ions. Formation of the nanowire network is complete when the solvent is completely removed from the coating to form a dry film, and while not wanting to be limited by theory, the fusing process is believed to be related to the concentration of the halide anions during the drying process. A person of ordinary skill in the art will recognize that additional ranges of concentration within the explicit ranges above are contemplated and are within the present disclosure.

After completing the fusing process, the fused metal nanowire networks are ready for any additional further processing to form the final product. For example, the coating or film containing the metal nanowire networks may be rinsed to remove unreacted sintering agents, and/or may be encapsulated with a protective coating. Due to the high transparency with low electrical resistance, the fused nanowire networks are well suited for the formation of transparent conductive electrodes, transparent composites, which can be used for solar cells, displays, touch screens, solar windows, capacitive switches, and the like.

EXAMPLES

Silver nanowires with different sizes purchased from either ACS Materials or Seashell Technology, LLC (CA, USA) were used in the following examples. The properties of the silver nanowires were an average diameter of 60 nm and an average length of 10 microns or an average diameter of 115 nm and an average length of 30 microns.

Example 1—Fabrication of Transparent Conductive Material Using HCl Vapor Treatment This example demonstrates the ability to use a vapor based fusing agent to chemically drive the fusing of silver nanowires to dramatically improve the electrical conductivity.

Commercially available silver nanowires (AgNWs) were dispersed in alcohols e.g. ethanol or isopropanol to form an AgNWs dispersion. The AgNWs dispersions were typically in the 0.1-1.0% wt range. The dispersion was then deposited on glass or polyethylene terephthalate (PET) surfaces as an AgNWs film using a spray coating or a hand-drawn rod approach. The AgNWs film was then exposed briefly to HCl vapour as a fusing agent. Specifically, the AgNWs film was exposed to HCl vapour from a concentrated HCl solution at room temperature for about 10 seconds. AgNWs from two different vendors were used. The sheet resistance and transparency of the AgNWs film before and after the treatment with HCl vapour were measured and recorded. The data of AgNWs from the first vendor is listed in Table 2 and the date of AgNWs from the second vender is listed in Table 3 below.

TABLE 2

| Sample No. | Sheet Resistance Before HCl (ohm/sq) | Sheet Resistance After HCl (ohm/sq) |
| --- | --- | --- |
| 1 | 10000000 | 660 |
| 2 | 83000 | 60 |
| 3 | 10000000 | 1909 |
| 4 | 10000000 | 451 |
| 5 | 800000 | 113.4 |
| 6 | 695000 | 30 |
| 7 | 10000000 | 62 |
| 8 | 399000 | 562 |
| 9 | 14,200 | 53.4 |
| 10 | 10000000 | 283 |
| 11 | 10000000 | 1260 |
| 12 | 10000000 | 364 |
| 13 | 10000000 | 6700 |
| 14 | 10000000 | 1,460 |
| 15 | 10000000 | 70.5 |
| 16 | 10000000 | 2280 |

TABLE 2-continued

| Sample No. | Sheet Resistance Before HCl (ohm/sq) | Sheet Resistance After HCl (ohm/sq) |
|---|---|---|
| 17 | 10000000 | 155 |
| 18 | 10000000 | 1654 |
| 19 | 10000000 | 926 |

TABLE 3

| Sample | Sheet Resistance Before HCl (ohm/sq) | Sheet Resistance After HCl (ohm/sq) |
|---|---|---|
| 1 | 13180 | 253 |
| 2 | 6200000 | 244 |
| 3 | 6030 | 115 |
| 4 | 32240 | 43.6 |
| 5 | 4300000 | 68.3 |
| 6 | 10000000 | 1060 |
| 7 | 10000000 | 47.5 |
| 8 | 3790 | 61.7 |
| 9 | 4690 | 42.4 |
| 10 | 404 | 37.5 |

Figure 3:
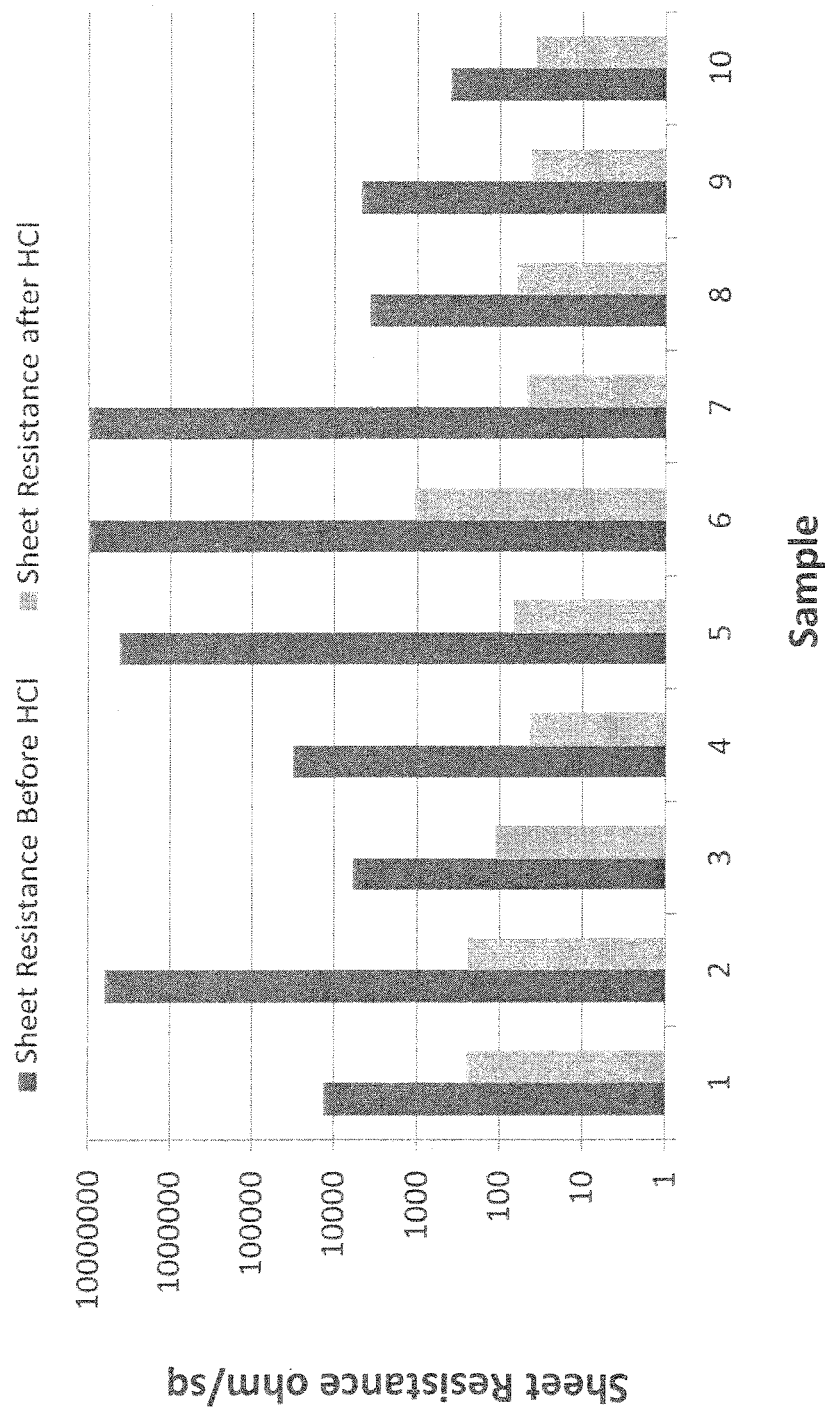
FIG. 3 is a plot of sheet resistance of the samples from the second vendor tested before and after the HCl vapor treatment showing dramatic improvement in conductivity.

Because the large numerical range involved, the data were plotted in logarithmic format in figures so the small numbers can also be visualized graphically. The data from table 2 was plotted in FIG. 2 and data from table 3 was plotted in FIG. 3. The films corresponding to the electrical conductivity results in Tables 2 and 3 had moderate loadings with corresponding reasonable transparency to visible light. As shown in FIG. 2, the conductivity of the AgNWs film improved over 4 to 5 orders of magnitude after the HCl vapour treatment. Additionally, these AgNWs films showed transparencies at 550 nm greater than 75%, which decreased less than 0.5% after HCl vapor treatment. Similarly, in FIG. 3, dramatic improvement in conductivity was also observed. The properties of the nanowire networks after fusing were relatively independent of the properties of the initial nanowires for these two sets of nanowires, but the longer nanowires exhibited overall a reduced electrical resistance prior to fusing.

Figure 4:
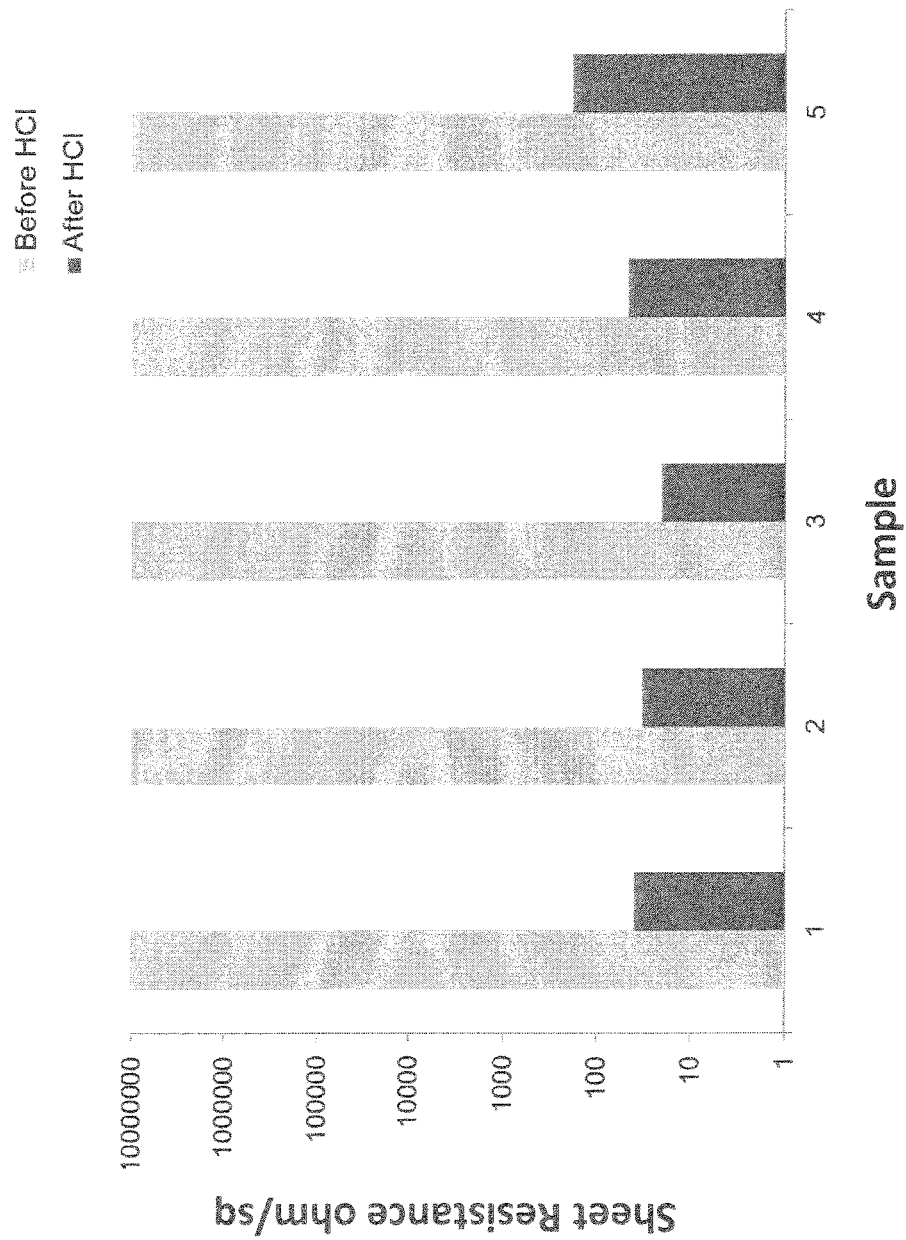
FIG. 4 is a plot of sheet resistance of the samples tested before and after the HCl vapor treatment having a transparency at 550 nm greater than 85%.

Additional AgNWs films were formed that has transparencies at 550 nm greater than 85%. These films were also treated with HCl vapor for about 10 seconds, and the sheet resistances of the AgNWs films before and after the HCl vapour treatment were measured. The results for one set of samples are presented in Table 4, and results for another set of samples are plotted in FIG. 4. Samples 2, 3, and 4 in FIG. 4 in particular have sheet conductivity between 30 to 50 ohm/sq while maintaining the transparency of the films above 85%. The results shown in Table 4 clearly demonstrate the ability to obtain transmission with 550 nm light greater than 90% with sheet resistance values less than 50 ohm/sq.

TABLE 4

| Resistance Prior to Sintering | Resistance After Sintering | Transmission at 550 nm (Conductive Film Only) |
|---|---|---|
| 801 | 45 | 89.1 |
| >$10^6$ | 40 | 88.9 |
| >$10^6$ | 33 | 88.1 |
| >$10^6$ | 20 | 87.8 |
| >$10^6$ | 46 | 90.6 |
| >$10^6$ | 182 | 92.4 |
| >$10^6$ | 129 | 91.6 |
| >$10^6$ | 85 | 89.2 |

Example 2—Observation of the Fusing of the Silver Nanowires

This example provides evidence of nanowire physical fusing as a result of contact with chemical fusing agents.

Figure 5:
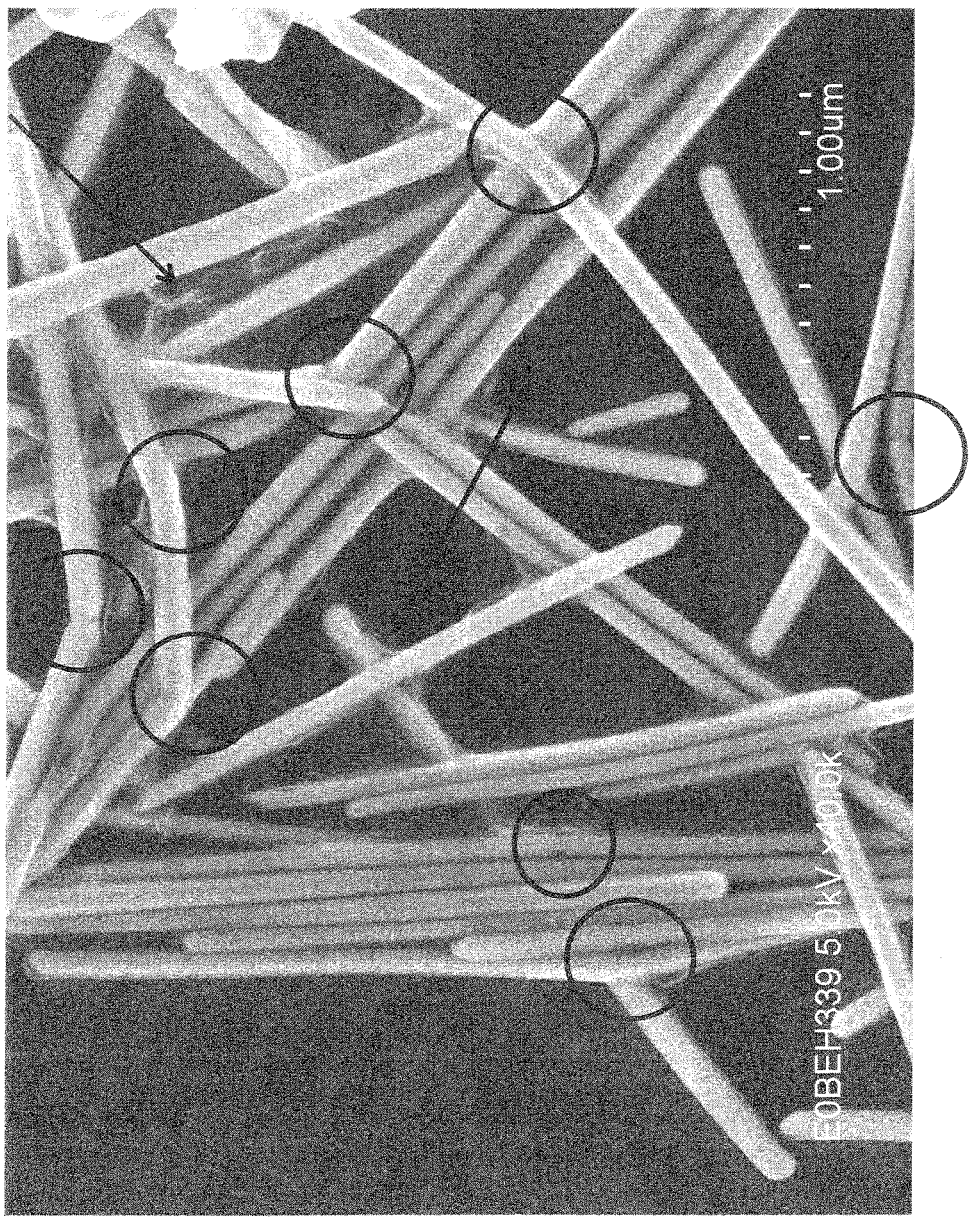
FIG. 5 is a scanning electron micrograph (SEM) of silver nanowires before any treatment.
Figure 6:
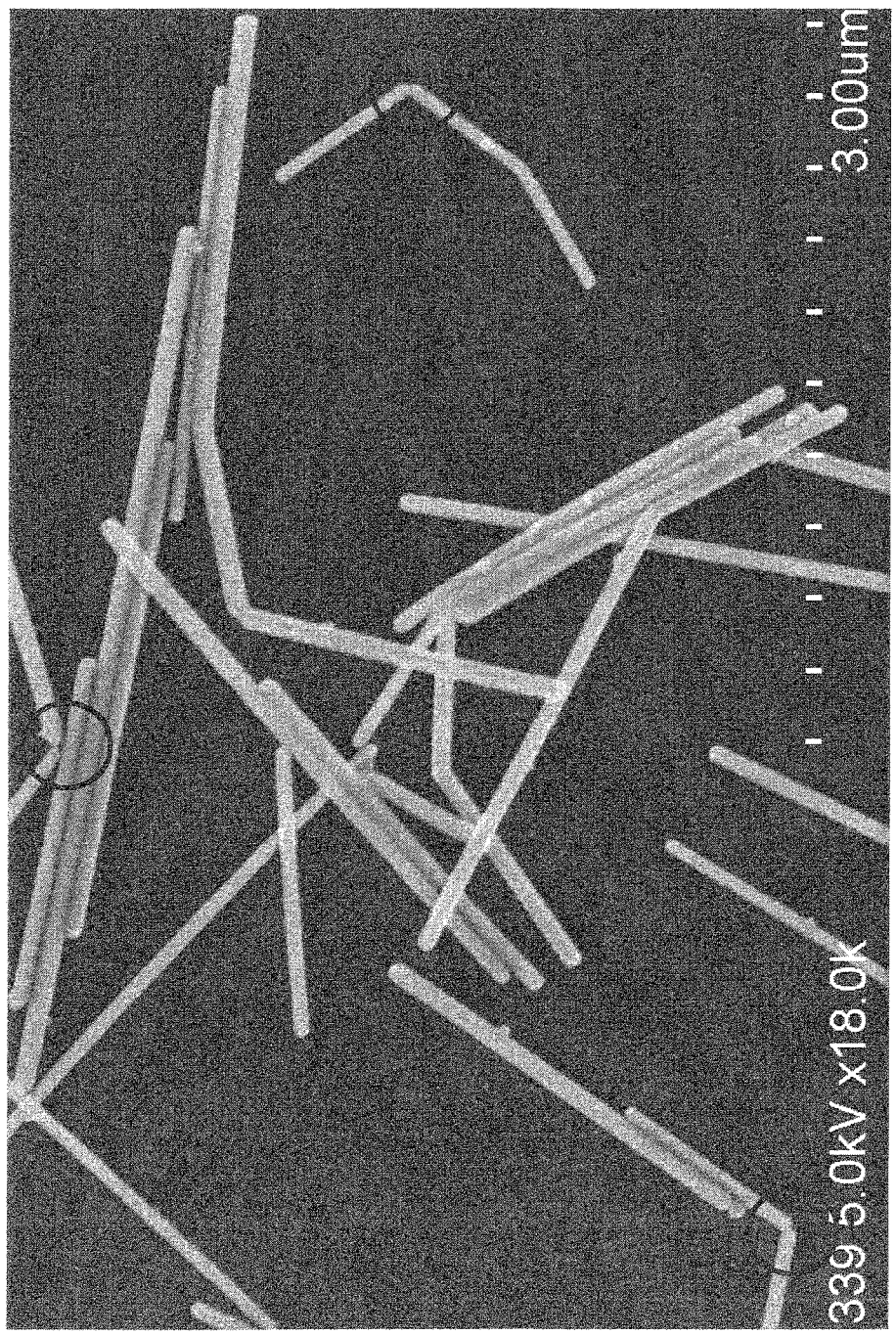
FIG. 6 is a SEM micrograph of silver nanowires after heat treatment.
Figure 7:
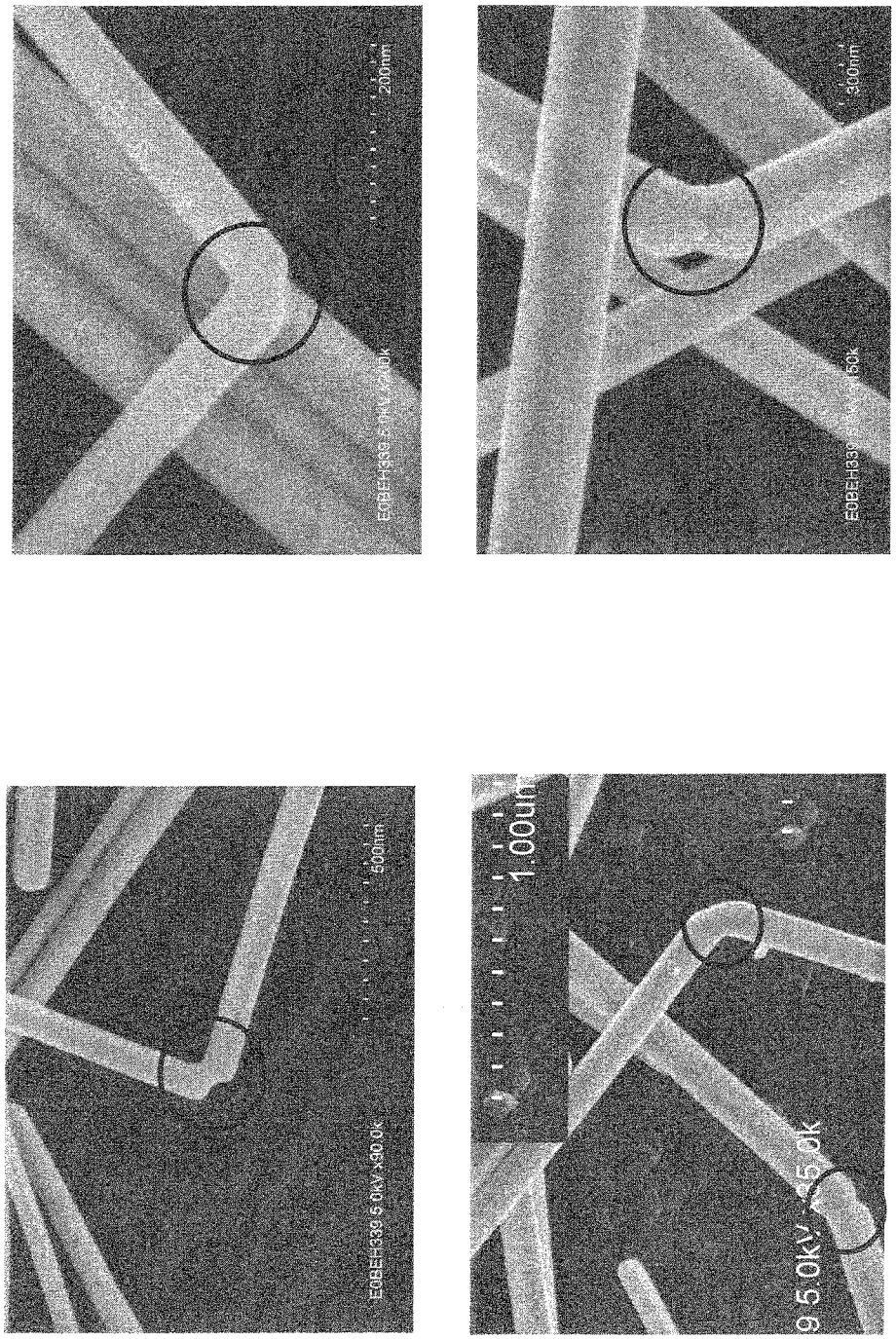
FIG. 7 is SEM micrographs of fused silver nanowires after HCl vapor treatment.

The dramatic conductivity improvement observed in Example 1 can be attributed to the fusing of some of the silver nanowires with adjacent silver nanowires. Scanning electron micrographs (SEM) of the silver nanowires before treatment were obtained and are shown in FIG. 5. As shown in FIG. 5, some of the ends (indicated by the circles) of the silver nanowires appear to touch each other, but the ends apparently do not appear to be fused together. Additionally, polyvinylpyrrolidone (PVP) coating (indicated by arrows in the figure) can be seen to be present around the rods. As a comparison, the silver nanowires shown in FIG. 5 were heated at 100° C. for 10 minutes. No appreciable conductivity change has been observed after the heating. SEM micrographs of the silver nanowires after the heat treatment were obtained and are shown in FIG. 6. Heating does not appear to have fused the ends as shown in FIG. 6, some of the ends (indicated by the circles) of the silver nanowires do not appear to be fused together. Scanning electron micrographs were obtained for nanowire networks after the HCl vapor treatment and are shown in FIG. 7. SEM of the silver nanowires in FIG. 7 after the HCl treatment showed the ends (indicated by the circles) of the silver nanowires have been fused together, and other locations of contact between adjacent nanowires are believed to similarly fuse to form fused silver nanowire networks.

Example 3—Fabrication of Transparent Conductive Material Using Halide Solution Treatment This example demonstrated the reduction in electrical resistance through the treatment of the networks with solutions containing halide anions.

Figure 8:
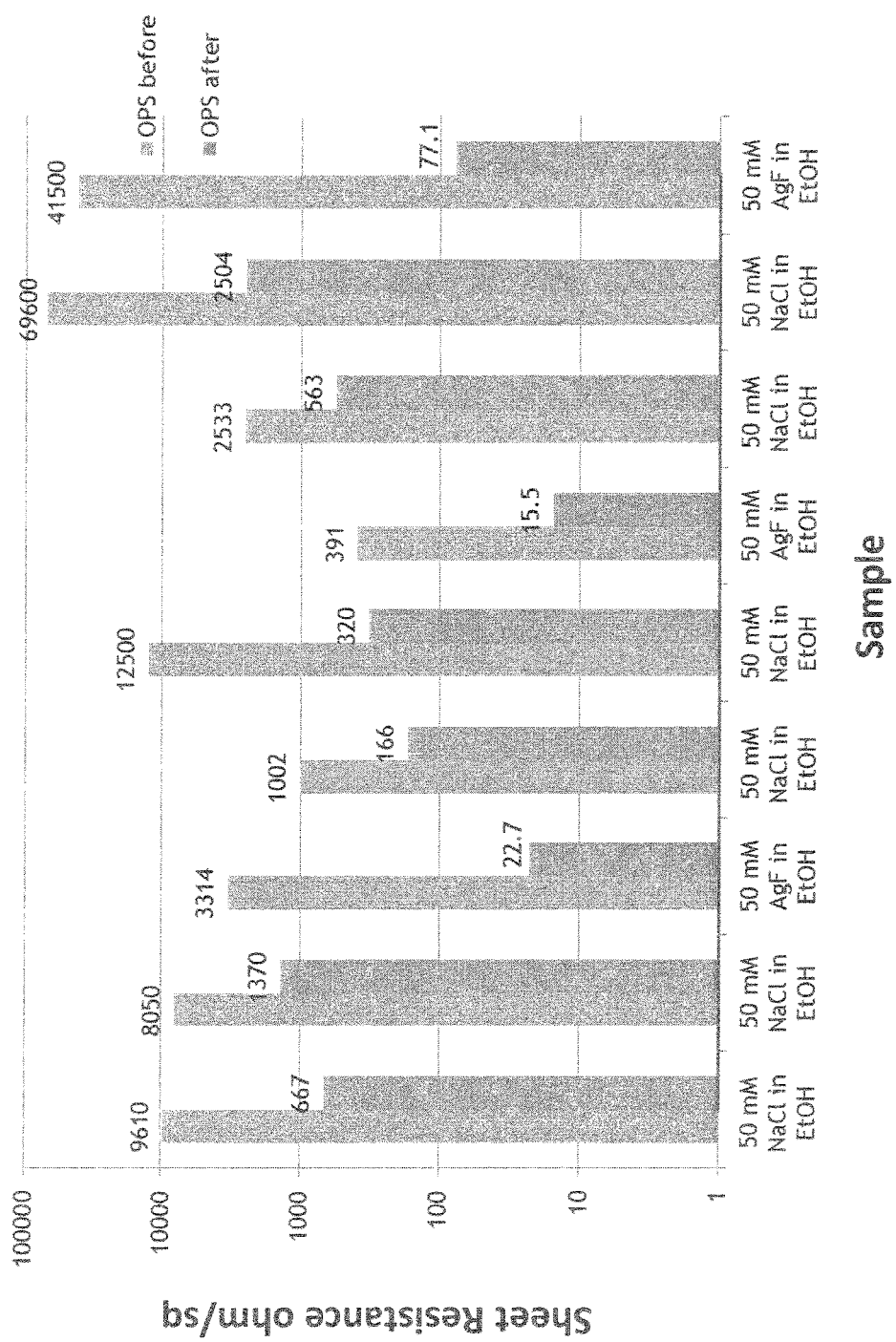
FIG. 8 is a plot of sheet resistance of samples treated with 5 mM NaCl in ethanol and AgF in ethanol solutions.

Specifically, 50 mM solutions of AgF or NaCl in ethanol were used to treat the AgNWs films. When the fusing agent solution is used, the AgNWs film was submerged or covered with the fusing agent solution for about 10 to about 30 seconds, or dilute solutions of AgF or NaCl were spray coated (from ethanol) onto the AgNW. The AgNWs were then allowed to dry. The sheet resistance of the AgNWs film before and after the treatment with the halide solutions were measured and the results are shown in FIG. 8. As shown in FIG. 8 dramatic conductivity improvement is also observed of the AgNWs films treated with halide solutions, with AgF treated samples showing even more pronounced improvement compared to the NaCl treated samples. In general, the transmission of light changed marginally (<5%) and less than 1% if residual salt solution was removed. Residual salt was removed by spraying gently with water or ethanol.

Dramatic improvements in conductivity with negligible changes in transparency are important for transparent conductor applications. The conductivity of transparent conductors is often improved by adding more conducting materials, for example more AgNWs, but the transmission can dramatically decrease. The methods and processes described herein provide a convenient and cost effective approach to dramatically improve the conductivity of nanowire materials without sacrificing transparency or adding additional nanowires.

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein.

What is claimed is:

1. A material comprising a transparent conductive coating and a substrate on which the coating is supported, the coating comprising a fused elemental metal nanowire network, wherein the material has a transmittance for visible light of at least 90% and the transparent conductive coating has a sheet resistance of no more than 100 Ohms/square.

2. The material of claim 1 wherein the metal nanowires fused to form the fused metal nanowire network have an aspect ratio from about 50 to about 5000 and a diameter of no more than about 250 nm.

3. The material of claim 1 wherein the metal nanowires fused to form the fused metal nanowire network have an aspect ratio from about 100 to about 2000 and a diameter from about 10 nm to about 120 nm.

4. The material of claim 1 wherein the fused metal nanowire network comprises silver, copper, gold, indium, tin, iron, titanium, platinum, palladium, nickel, cobalt, an alloy, or combination thereof.

5. The material of claim 1 wherein the fused metal nanowire network comprises silver.

6. The material of claim 1 wherein the fused metal nanowire network on the substrate has a surface loading level that is about 0.1 µg/cm$^2$ to about 5 mg/cm$^2$.

7. The material of claim 1 wherein the substrate comprises glass, polymer, inorganic semiconducting material, inorganic dielectric material, laminates thereof, composites thereof or combinations thereof.

8. The material of claim 7 wherein the polymer comprises polyethylene terephthalate (PET), polyacrylate, polyolefin, polyvinyl chloride, fluoropolymer, polyamide, polyimide, polysulfone, polysiloxane, polyetheretherketone, polynorbornene, polyester, polyvinyl alcohol, polyvinyl acetate, acrylonitrile-butadiene-styrene copolymer, polycarbonate, a copolymer thereof or blend thereof.

9. The material of claim 1 further comprising a polymer film overcoat.

10. The material of claim 1 having a sheet resistance of no more than 75 ohm/sq.

11. A device comprising at least one transparent electrode having a transparent conductive material comprising a fused metal nanowire network of claim 1.

12. The material of claim 1 wherein the fused metal nanowire network on the substrate has a surface loading level that is about 1 µg/cm$^2$ to about 1 mg/cm$^2$.

13. The material of claim 1 having a sheet resistance of no more than 60 ohm/sq.

14. The material of claim 1 wherein the fused metal nanowire network comprise silver and wherein the substrate comprises polymer.

15. The material of claim 14 further comprising a polymer film overcoat.

16. The material of claim 1 wherein the fused metal nanowire network comprises gold, copper, or a combination thereof.

17. The material of claim 1 wherein the material has a transmittance for visible light of at least 90.5%.

* * * * *